United States Patent
Liu et al.

(10) Patent No.: US 9,436,228 B2
(45) Date of Patent: Sep. 6, 2016

(54) FIXING MECHANISM WITH QUICK-RELEASING FUNCTION AND RELATED ELECTRONIC DEVICE

(71) Applicant: Wistron Corporation, New Taipei (TW)

(72) Inventors: Yuanqing Liu, New Taipei (TW); Hsing-Min Chang, New Taipei (TW); Yuanlin Chen, New Taipei (TW); Shin-Yi Hsieh, New Taipei (TW); Chia-Sheng Lin, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/709,469

(22) Filed: May 11, 2015

(65) Prior Publication Data

US 2016/0179144 A1    Jun. 23, 2016

(30) Foreign Application Priority Data

Dec. 22, 2014    (CN) .......................... 2014 1 0812417

(51) Int. Cl.
*H05K 5/00*    (2006.01)
*G06F 1/16*    (2006.01)
*H05K 5/02*    (2006.01)

(52) U.S. Cl.
CPC ........... *G06F 1/1675* (2013.01); *H05K 5/0013* (2013.01); *H05K 5/0221* (2013.01)

(58) Field of Classification Search
CPC .. G06F 1/1637; G06F 1/1656; G06F 1/1679; G06F 1/166; G06F 1/1675; H05K 5/0295; H05K 5/0013; H05K 5/0221
USPC ............ 361/679.01, 679.02, 679.33–679.39, 361/679.55–679.58, 752, 754, 755, 756, 361/724–727; 312/223.1–223.2
See application file for complete search history.

(56) References Cited

U.S. PATENT DOCUMENTS

| 2012/0099271 A1* | 4/2012 | Hsu ........................ G06F 1/181 361/679.58 |
| 2014/0097729 A1 | 4/2014 | Kuo |

* cited by examiner

*Primary Examiner* — Anthony Haughton
*Assistant Examiner* — Ingrid Wright
(74) *Attorney, Agent, or Firm* — Winston Hsu; Scott Margo

(57) ABSTRACT

A fixing mechanism with quick-releasing function for assembling a cover with a base includes a buckling component and an actuating component. The buckling component includes a main body, a first wedging portion, a hooking portion and a pushing portion. The first wedging portion is disposed on a hole on the main body. The hooking portion and the pushing portion are disposed on the main body and respectively protrude from the main body at different directions. The actuating component includes a shaft body and a second wedging portion. The hooking portion is engaged with a constraining portion of the base to constrain a movement between the base and the cover while the buckling component is in the first position. The pushing portion pushes the constraining portion to separate the base and the cover while the buckling component is in the second position.

26 Claims, 11 Drawing Sheets

FIXING MECHANISM WITH QUICK-RELEASING FUNCTION AND RELATED ELECTRONIC DEVICE

BACKGROUND OF THE INVENTION

1. Field of the Disclosure

The present disclosure relates to a fixing mechanism for fixing a cover and a related electronic device, and more particularly, to a fixing mechanism for fixing a cover by quick-releasing function and a related electronic device.

2. Description of the Prior Art

A consumer electronic product usually has a detachable casing to conveniently replace electronic components disposed inside the casing. The electronic product includes a frame, a front cover and a rear cover. The electronic components are disposed inside the frame, a displaying screen is disposed on the frame and constrained by the front cover, and the rear cover is assembled with the frame to protect the electronic components. The front cover which is designed according to the displaying screen is detached when the screen panel is in need of reparation. A screwdriver is utilized to remove screws or the bolts fixed on the rear cover, and the rear cover is separated from the frame by the wrench to repair the inner electronic components, such as the hard disk, the main board and the memory. For assembly of the rear cover and the frame, the rear cover is pressed onto the frame firstably, and then the screws or the bolts pass through the rear cover and the frame to tightly assemble the rear cover with the frame. Thus, a conventional fixing mechanism provides complicated operating process to assemble/disassemble the frame and the cover, the fixing component may be abraded by repeated operation, which means a thread structure of the screw is abraded, and a long-term operational period accordingly decreases repair efficiency and quality of the conventional fixing mechanism.

SUMMARY OF THE INVENTION

The present disclosure provides a fixing mechanism for fixing a cover by quick-releasing function and a related electronic device for solving above drawbacks.

According to the claimed disclosure, a fixing mechanism with quick-releasing function for assembling a cover with a base is disclosed. The fixing mechanism includes a buckling component and an actuating component. The buckling component includes a main body, first wedging portion, hooking portion and a pushing portion. A hole is formed on the main body. The first wedging portion is formed on an inner wall of the hole. The hooking portion is disposed on the main body and stretching from the main body outwardly at a first direction, and is adapted to engage with a constraining portion of the cover. The pushing portion is disposed on a position of the main body adjacent to the hooking portion and stretching from the main body outwardly at a second direction different from the first direction, and is adapted to push the constraining portion. The actuating component is adapted to drive rotation of the buckling component. The actuating component includes a shaft body and a second wedging portion. The shaft body pierces through the hole and is rotatably disposed on the base. The second wedging portion is formed on the shaft body and wedged with the first wedging portion. The shaft body is adapted to revolve on a structural axial direction of the shaft body to switch the buckling component between a first position and a second position. The hooking portion is engaged with the constraining portion to constrain a relative movement between the cover and the base while the buckling component is located in the first position, the pushing portion pushes the constraining portion to separate the cover from base while the buckling component is located in the second position.

According to the claimed disclosure, the hooking portion is engaged with a constrained surface of the constraining portion, and the pushing portion pushes a pressed surface of the constraining portion different from the constrained surface.

According to the claimed disclosure, a level height difference between the hooking portion and an axial center of the hole is greater than a level height difference between the pushing portion and the axial center while the buckling component is located in the first position. The level height difference between the hooking portion and the axial center is smaller than the level height difference between the pushing portion and the axial center while the buckling component is located in the second position.

According to the claimed disclosure, the hooking portion is engaged with the constraining portion while the buckling component is located in the first position, the hooking portion is separated from the constraining portion and the pushing portion presses the constraining portion while the buckling component is located in the second position.

According to the claimed disclosure, the fixing mechanism further includes a fixing component disposed on the base and pressing upon the actuating component and/or the buckling component, which means the fixing mechanism may press upon the actuating component, or upon the buckling component, or simultaneously upon the actuating component and the buckling component.

According to the claimed disclosure, the buckling component further includes a contacting portion disposed on a side of the main body opposite to the pushing portion. The contacting portion leans against the fixing component to constrain rotation of the buckling component.

According to the claimed disclosure, the fixing component includes a yielded structure and an abutted structure. The yielded structure provides rotary space to the contacting portion, and the contacting portion leans against the abutted structure.

According to the claimed disclosure, the main body includes a first side, a second side and a third side connected with each other. The first side is connected between the second side and the third side. The hooking portion is disposed on the first side, and the pushing portion and the contacting portion are respectively disposed on the second side and the third side and opposite to each other.

According to the claimed disclosure, the shaft body includes a first section, a second section and a third section, the second section is located between the first section and the third section. The second wedging portion is disposed on the second section, and the first section and the third section are rotatably disposed on the base.

According to the claimed disclosure, the shaft body further includes at least one annular slot structure disposed on the first section and/or the third section to be rotatably engaged with the base.

According to the claimed disclosure, the fixing mechanism further includes a resilient component disposed on the shaft body. Two ends of the resilient component respectively lean against the base and the buckling component.

According to the claimed disclosure, a slide slot structure is formed on the pushing portion, and an end of the resilient component is movably disposed inside the slide slot structure.

According to the claimed disclosure, the resilient component is a torsional spring.

According to the claimed disclosure, an electronic device with quick-releasing function includes a base, a cover and at least one fixing mechanism. The base is adapted to support a plurality of electronic components. The cover is assembled with the base to cover the plurality of electronic components. The cover includes a constraining portion. The fixing mechanism is disposed on the base. The fixing mechanism includes a buckling component and an actuating component. The buckling component includes a main body, first wedging portion, hooking portion and a pushing portion. A hole is formed on the main body. The first wedging portion is formed on an inner wall of the hole. The hooking portion is disposed on the main body and stretching from the main body outwardly at a first direction, and is adapted to engage with a constraining portion of the cover. The pushing portion is disposed on a position of the main body adjacent to the hooking portion and stretching from the main body outwardly at a second direction different from the first direction, and is adapted to push the constraining portion. The actuating component is adapted to drive rotation of the buckling component. The actuating component includes a shaft body and a second wedging portion. The shaft body pierces through the hole and is rotatably disposed on the base. The second wedging portion is formed on the shaft body and wedged with the first wedging portion. The shaft body is adapted to revolve on a structural axial direction of the shaft body to switch the buckling component between a first position and a second position. The hooking portion is engaged with the constraining portion to constrain a relative movement between the cover and the base while the buckling component is located in the first position, the pushing portion pushes the constraining portion to separate the cover from base while the buckling component is located in the second position.

The fixing mechanism of the present disclosure has advantages of simple structure and easy operation. The fixing mechanism utilizes the actuating component to rotate the buckling component, the hooking portion and the pushing portion alternately actuates the constraining portion, and engagement stability between the buckling component and the constraining portion can be maintained without constraint deterioration by mechanical abrasion even through the cover is repeatedly assembled and disassembled, so as to obviously increase operational efficiency of assembling and disassembling the cover of the electronic device.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
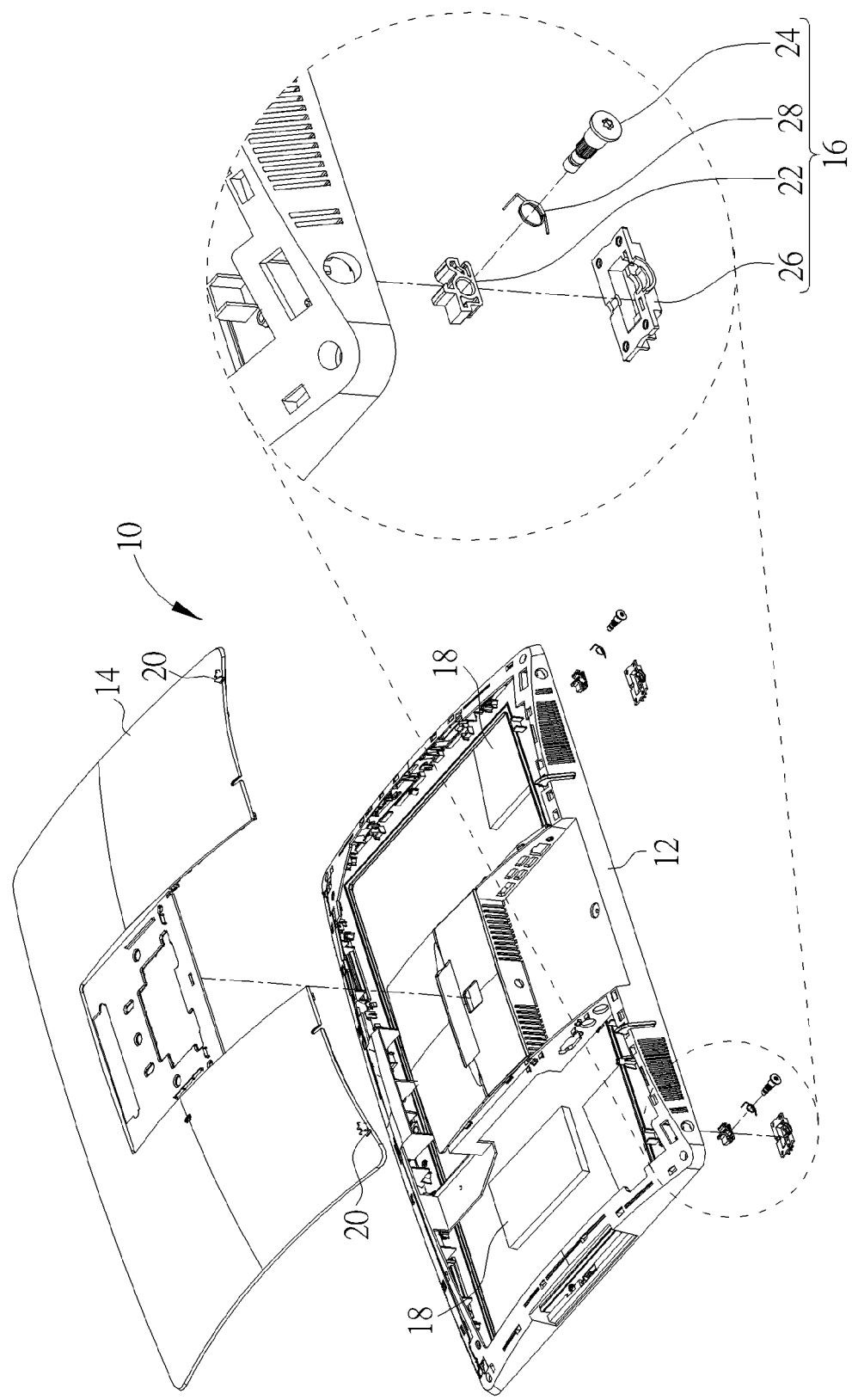
FIG. 1 and FIG. 2 respectively are exploded diagrams of an electronic device in different views according to an embodiment of the present disclosure.
Figure 2:
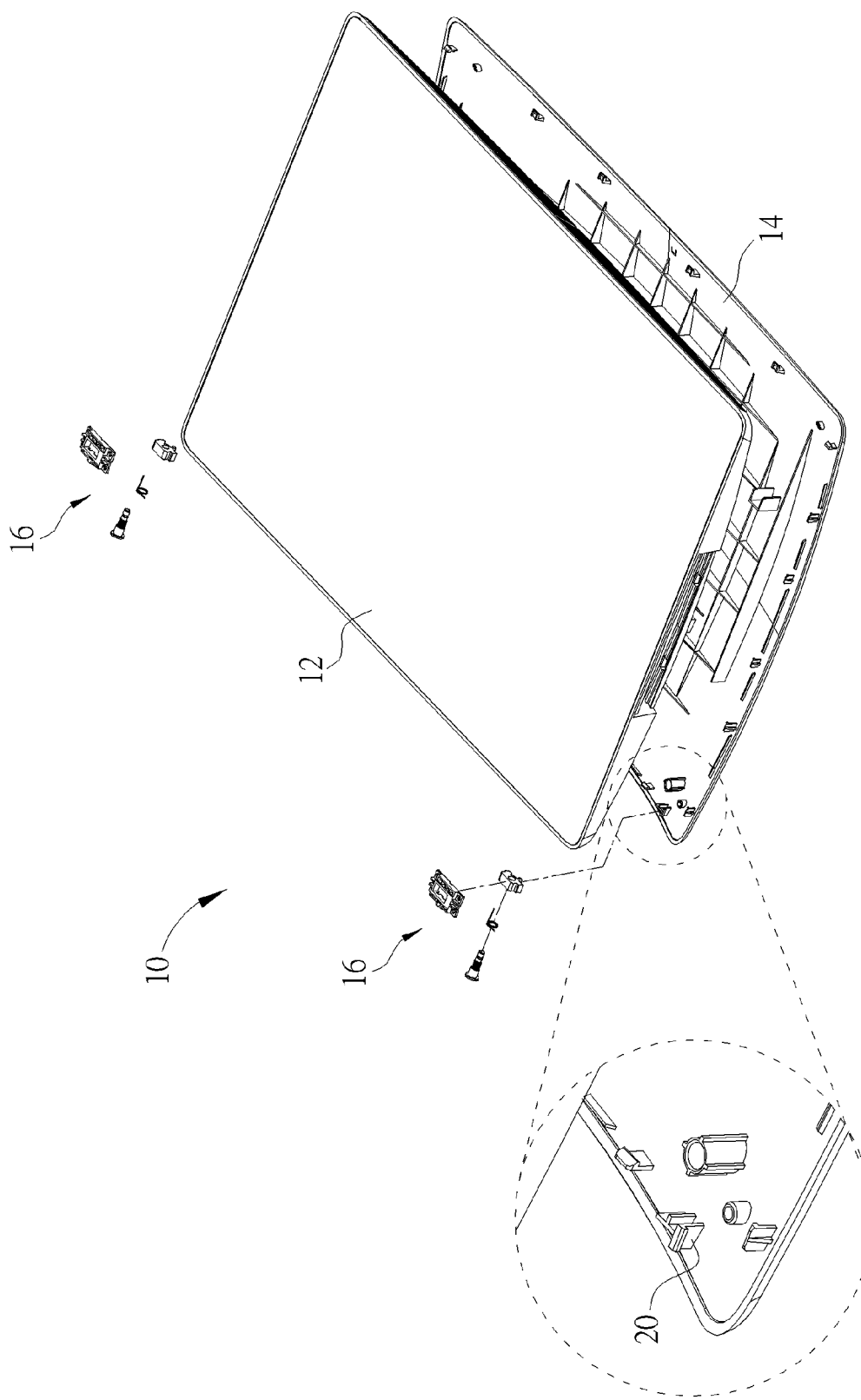
Figure 3:
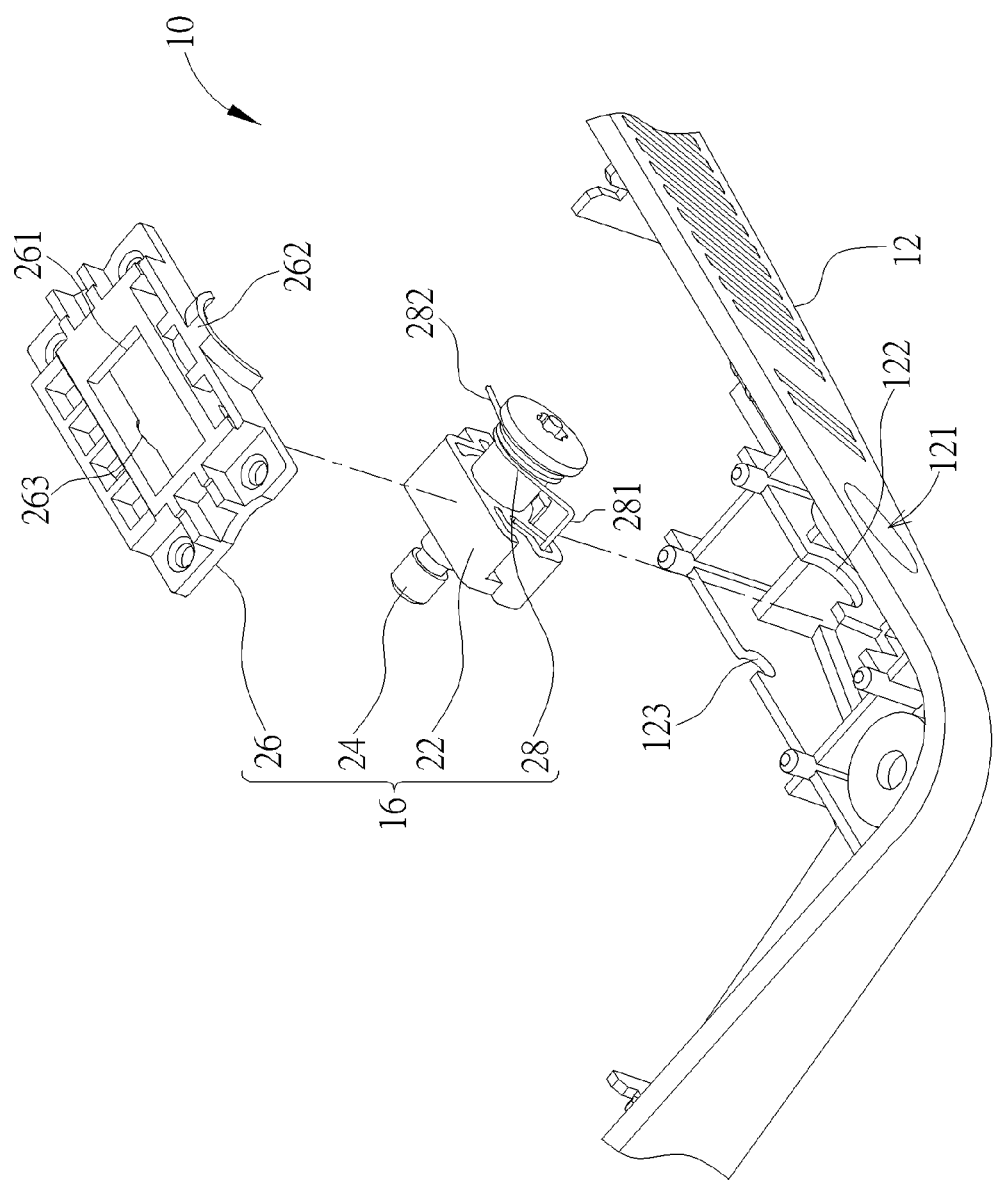
FIG. 3 to FIG. 5 respectively are diagrams of a part of the electronic device in different assembly process according to the embodiment of the present disclosure.
Figure 4:
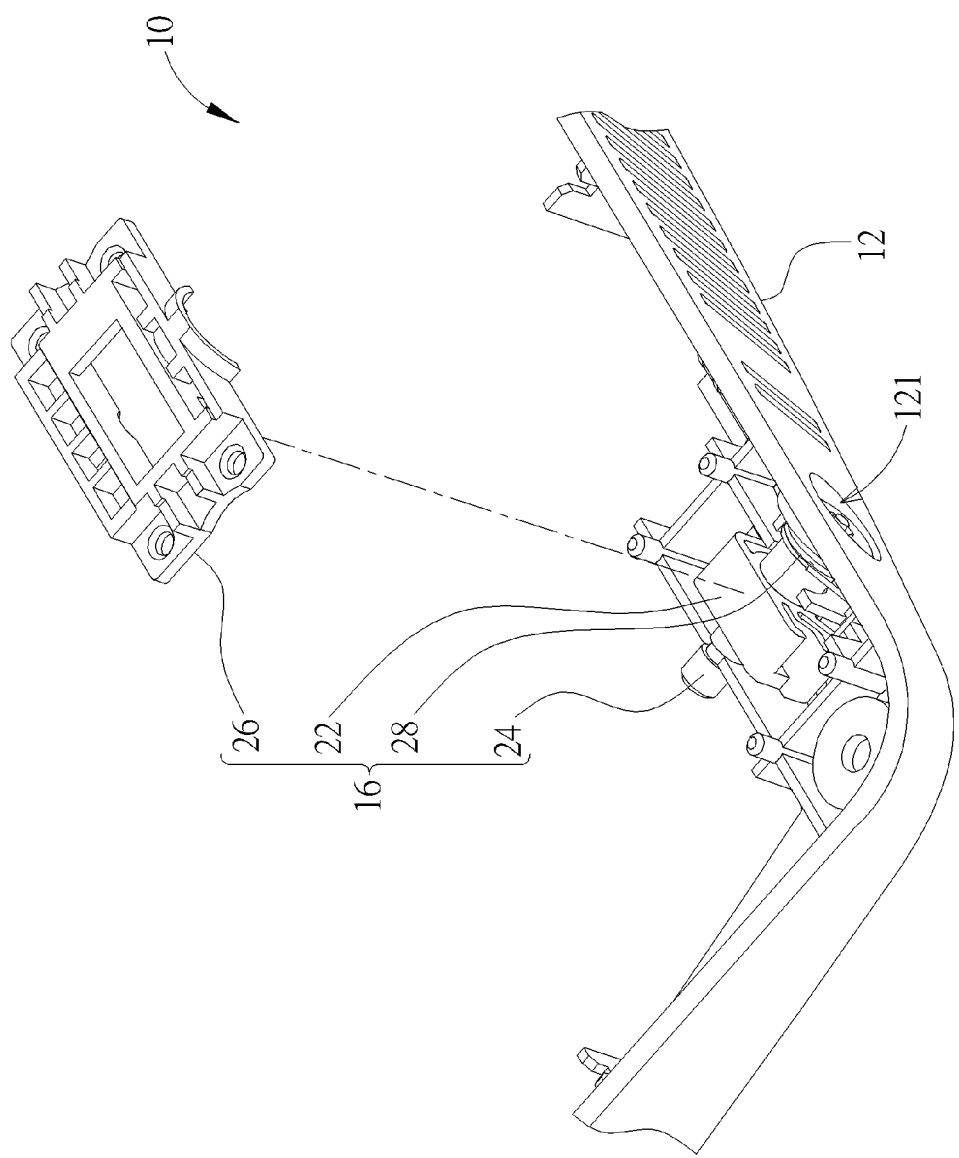
Figure 5:
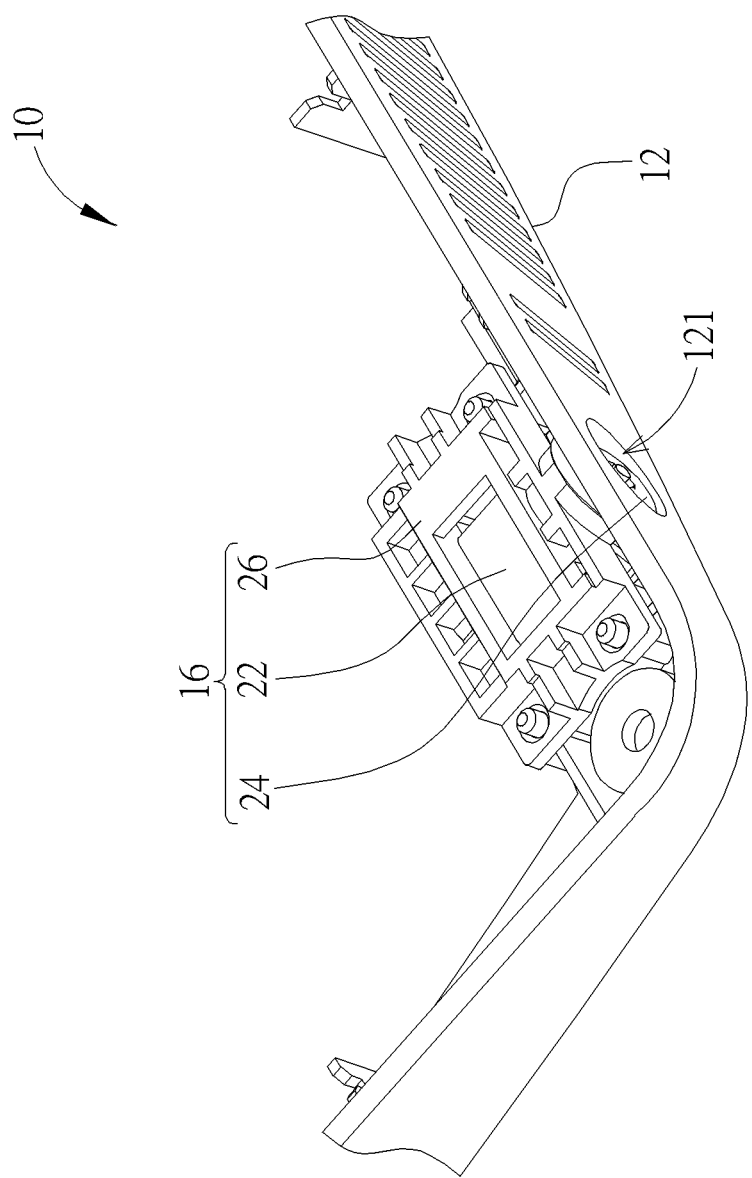

Please refer to FIG. 1 to FIG. 5. FIG. 1 and FIG. 2 respectively are exploded diagrams of an electronic device 10 in different views according to an embodiment of the present disclosure. FIG. 3 to FIG. 5 respectively are diagrams of a part of the electronic device 10 in different assembly process according to the embodiment of the present disclosure. The electronic device 10 includes a base 12, a cover 14 and at least one fixing mechanism 16. The base 12 is utilized to support a plurality of electronic components 18, such as the main board, the memory, the hard disk and so on. The cover 14 is detachably assembled with the base 12 to cover the electronic components 18 for protection. The electronic device 10 preferably has two fixing mechanisms 16 respectively disposed different corners of the base 12. An amount and deposition of the fixing mechanism 16 are not limited to the above-mentioned embodiment. The fixing mechanism 16 can be engaged with a constraining portion 20 of the cover 14 in a switchable manner to fix the cover 14 on the base 12 stably.

The fixing mechanism 16 includes a buckling component 22, an actuating component 24, a fixing component 26 and a resilient component 28. The actuating component 24 is a rod structure whereon the resilient component 28 is disposed. Two ends of the resilient component 28 respectively lean against the base 12 and the buckling component 22, so as to drive the buckling component 22 to rotate relative to the base 12 for recovery. The buckling component 22 can be engaged with the constraining portion 20 by resilient recovering force of the resilient component 28, to ensure that the cover 14 can be stably assembled with the base 12 without separation. The actuating component 24 is immovably assembled with the buckling component 22 but movably disposed on the base 12, and the buckling component 22 is rotated according to motion of the actuating component 24. The fixing component 26 can be disposed on the base 12 by a thermal melting method or a mechanical engagement method. The fixing component 26 presses upon the buckling component 22 and/or the actuating component 24 to constrain movement of the foresaid pressed component, and the buckling component 22 and the actuating component 24 cannot be separated from the base 12.

For example, the fixing component 26 includes a restraining portion 261. The restraining portion 261 can directly press over the buckling component 22 to prevent the buckling component 22 from being separated from the base 12 while the fixing component 26 is assembled with the base 12. In this embodiment of the present disclosure, the base 12 includes first annular structures 122, 123, and the fixing component 26 includes second annular structures 262, 263. When the fixing component 26 is assembled with the base 12, the second annular structure 262 presses the actuating component 24 so that a first section 421 (which is illustrated in FIG. 7) of the actuating component 24 can be buckled by the second annular structure 262 and the first annular structure 122, and the second annular structure 263 presses the actuating component 24 to accommodate an annular slot structure 48 of the actuating component 24 inside the first annular structure 123, therefore the actuating component 24 can be rotatably disposed on the base 12.

Figure 6:
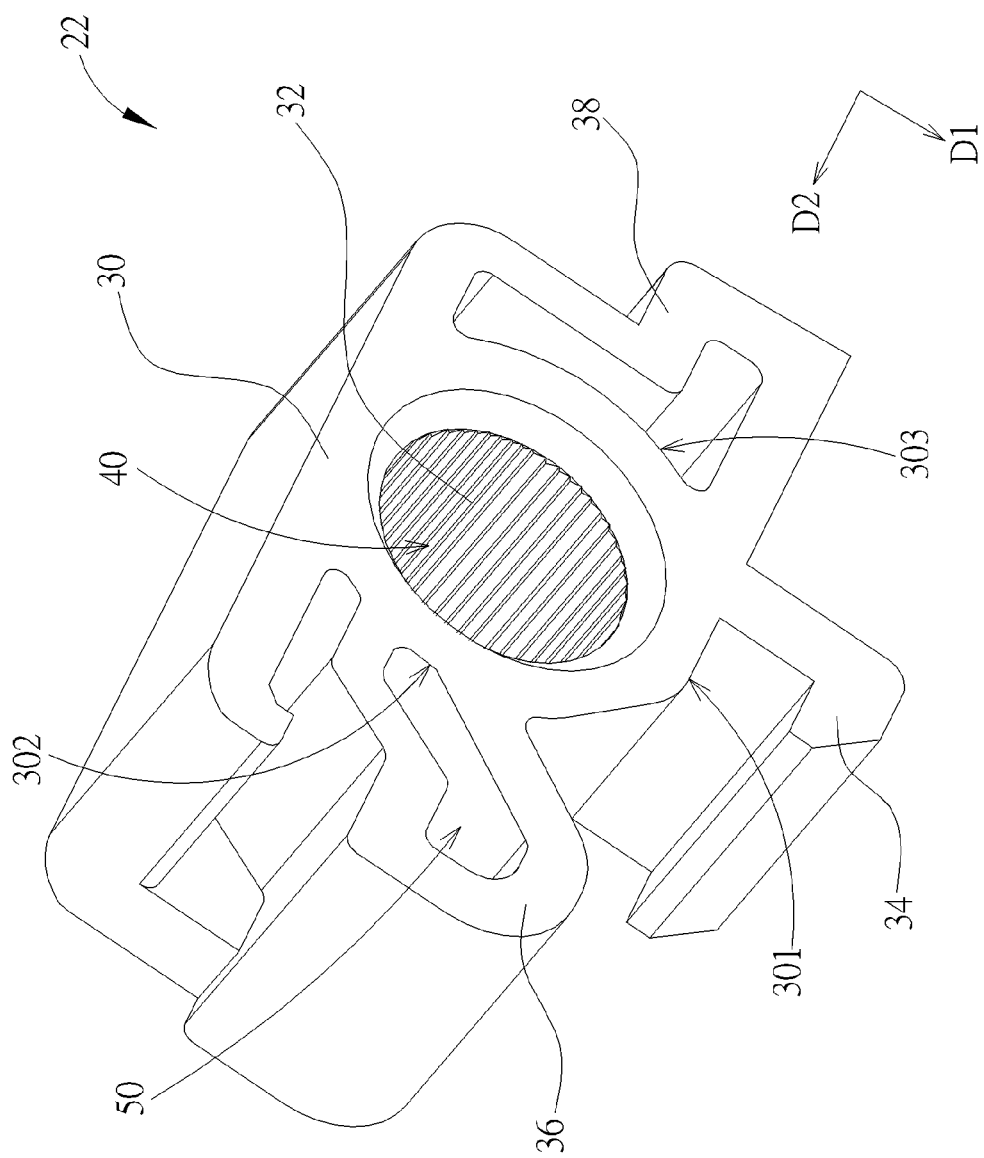
FIG. 6 is a diagram of a buckling component according to the embodiment of the present disclosure.
Figure 7:
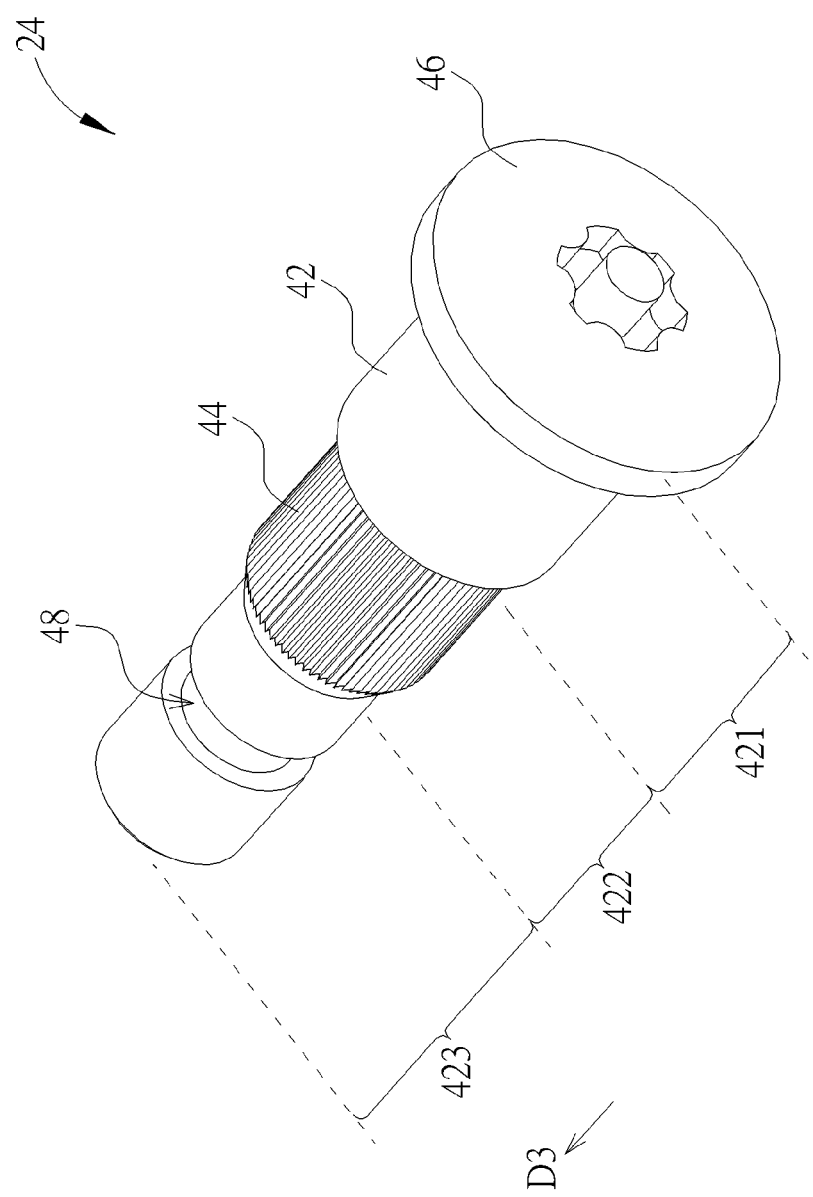
FIG. 7 is a diagram of an actuating component according to the embodiment of the present disclosure.

Please refer to FIG. 6 and FIG. 7. FIG. 6 is a diagram of the buckling component 22 according to the embodiment of the present disclosure. FIG. 7 is a diagram of the actuating component 24 according to the embodiment of the present disclosure. The buckling component 22 includes a main body 30, a first wedging portion 32, a hooking portion 34, a pushing portion 36 and a contacting portion 38. A hole 40 wherethrough the actuating component 24 passes is formed on middle of the main body 30. The first wedging portion 32 can be a sawtooth structure formed on an inner wall of the hole 40. The hooking portion 34 and the pushing portion 36 are disposed on adjacent positions of the main body 30, and stretch from the main body 30 outwardly respectively at a first direction D1 and a second direction D2. In this embodiment, the first direction D1 is substantially perpendicular to the second direction D2, and an angle between the first direction D1 and the second direction D2 further can be greater than or smaller than ninety degrees, which depends on design demand. The contacting portion 38 is disposed on a side of the main body 30 opposite to the pushing portion 36. The main body 30 can include a first side 301, a second side 302 and a third side 303. The first side 301 is connected between the second side 302 and the third side 303. The hooking portion 34 is disposed on the first side 301, and the pushing portion 36 and the contacting portion 38 are respectively disposed on the second side 302 and the third side 303 and opposite to each other.

The actuating component 24 drives rotation of the buckling component 22. The actuating component 24 includes a shaft body 42, a second wedging portion 44 and a screw locking portion 46. The shaft body 42 passes through the hole 40 and is rotatably disposed on the base 12. The second wedging portion 44 is formed on an outer surface of the shaft body 42. The second wedging portion 44 is tightly wedged with the first wedging portion 32 while the shaft body 42 is installed inside the hole 40, and the buckling component 22 can be rotated according to motion of the actuating component 24. The screw locking portion 46 is disposed on an end of the shaft body 42. An auxiliary tool (such as the screwdriver) can insert into the screw locking portion 46 to simultaneously rotate the actuating component 24 and the buckling component 22. It should be mentioned that the buckling component 22 and the actuating component 24 are designed as two separated units in this embodiment; however, the buckling component 22 can further be integrated with the actuating component 24 monolithically to forma single unit, which depends on actual demand.

The shaft body 42 can be divided into a first section 421, a second section 422 and a third section 423, the second section 422 is located between the first section 421 and the third section 423. The screw locking portion 46 is disposed on the first section 421 and partially exposed out of the base 12 via the hole 121, as shown in FIG. 4 and FIG. 5, and the auxiliary tool can insert into the hole 121 conveniently to assemble with the screw locking portion 46 for actuation of the fixing mechanism 16. The first section 421 and the third section 423 are rotatably disposed on the first annular structures 122, 123 of the base 12 respectively, and the second section 422 is suspended between the first annular structures 122, 123 of the base 12. The second wedging portion 44 is disposed on the second section 422 to assemble with the buckling component 22. The buckling component 22 does not contact the base 12 while the buckling component 22 is rotated by the actuating component 24, to prevent operation of the fixing mechanism 16 from being affected by structural interference. In addition, at least one annular structure 48 of the shaft body 42 is optionally disposed on the first section 421 and/or the third section 423. The shaft body 42 can be stably installed on the base 12 in the rotatable manner by the annular slot structure 48.

Figure 8:
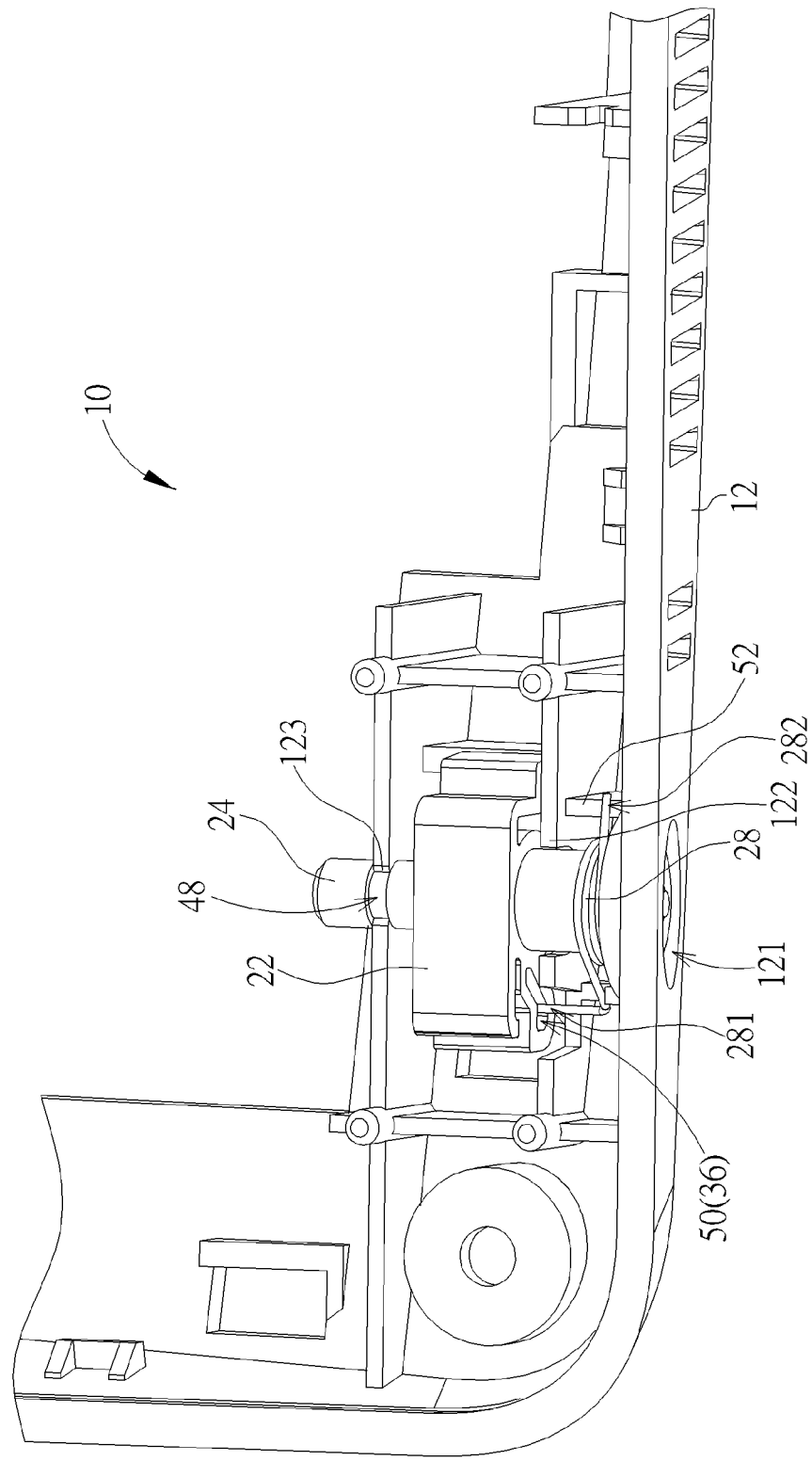
FIG. 8 is a diagram of apart of the electronic device in another view according to the embodiment of the present disclosure.

Please refer to FIG. 3, FIG. 4 and FIG. 8. FIG. 8 is a diagram of a part of the electronic device 10 in another view according to the embodiment of the present disclosure. The resilient component 28 preferably can be a torsional spring, which is disposed on the first section 421 of the shaft body 42. An end 281 of the resilient component 28 is movably disposed inside the slide slot structure 50 of the pushing portion 36, and the other end 282 of the resilient component 28 leans against a blocking portion 52 of the base 12. When pressure generated by the auxiliary tool applied to the screw locking portion 46 is removed, the end 281 of the resilient component 28 can slide along the slide slot structure 50, the end 281 may abut against an end of the slide slot structure 50 to automatically generate maximum torque by its own resilient recovering force, and the torque is applied to stably engage the hooking portion 34 with the constraining portion 20.

Figure 9:
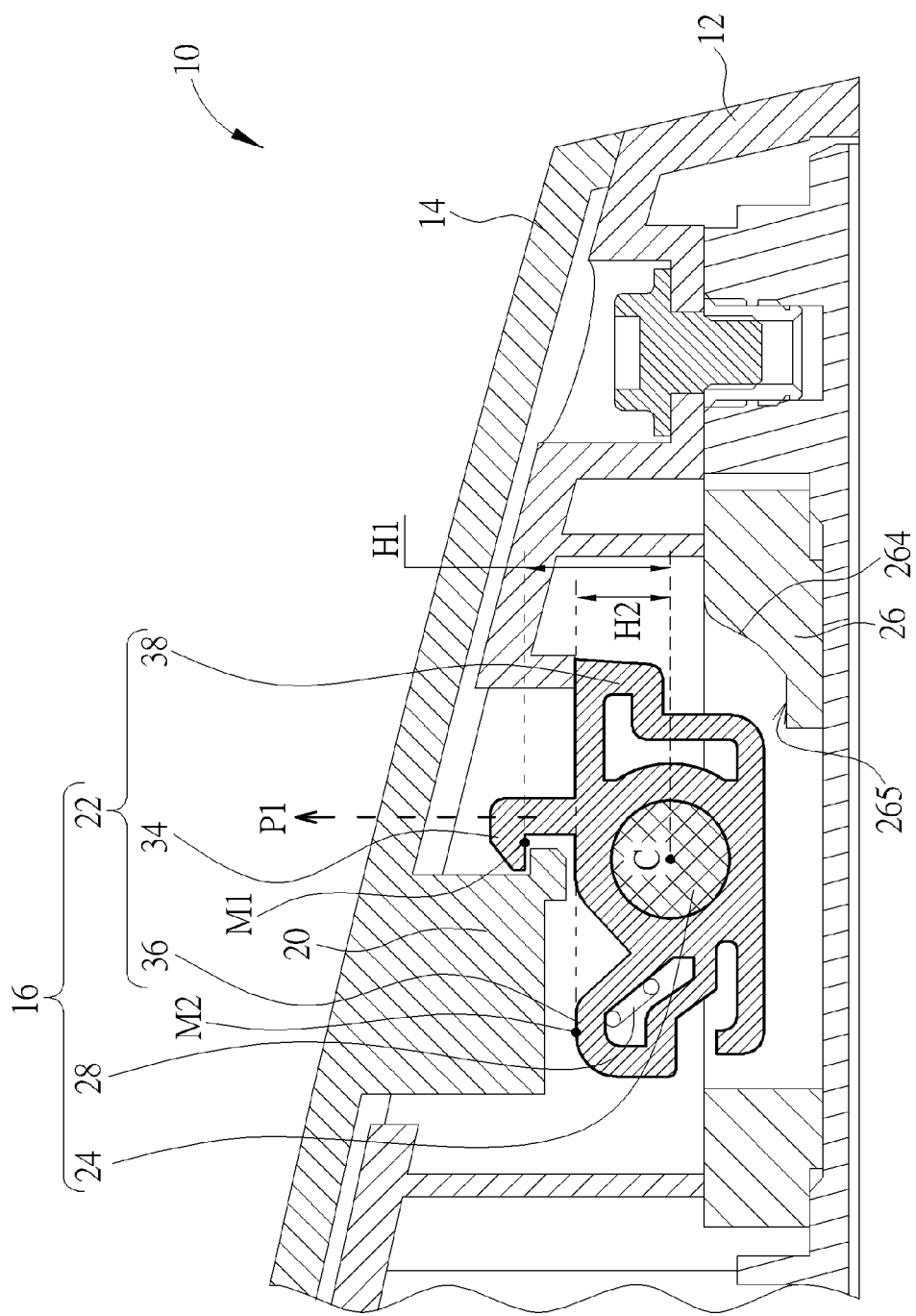
FIG. 9 to FIG. 11 respectively are diagrams of a fixing mechanism in different operational process according to the embodiment of the present disclosure.
Figure 10:
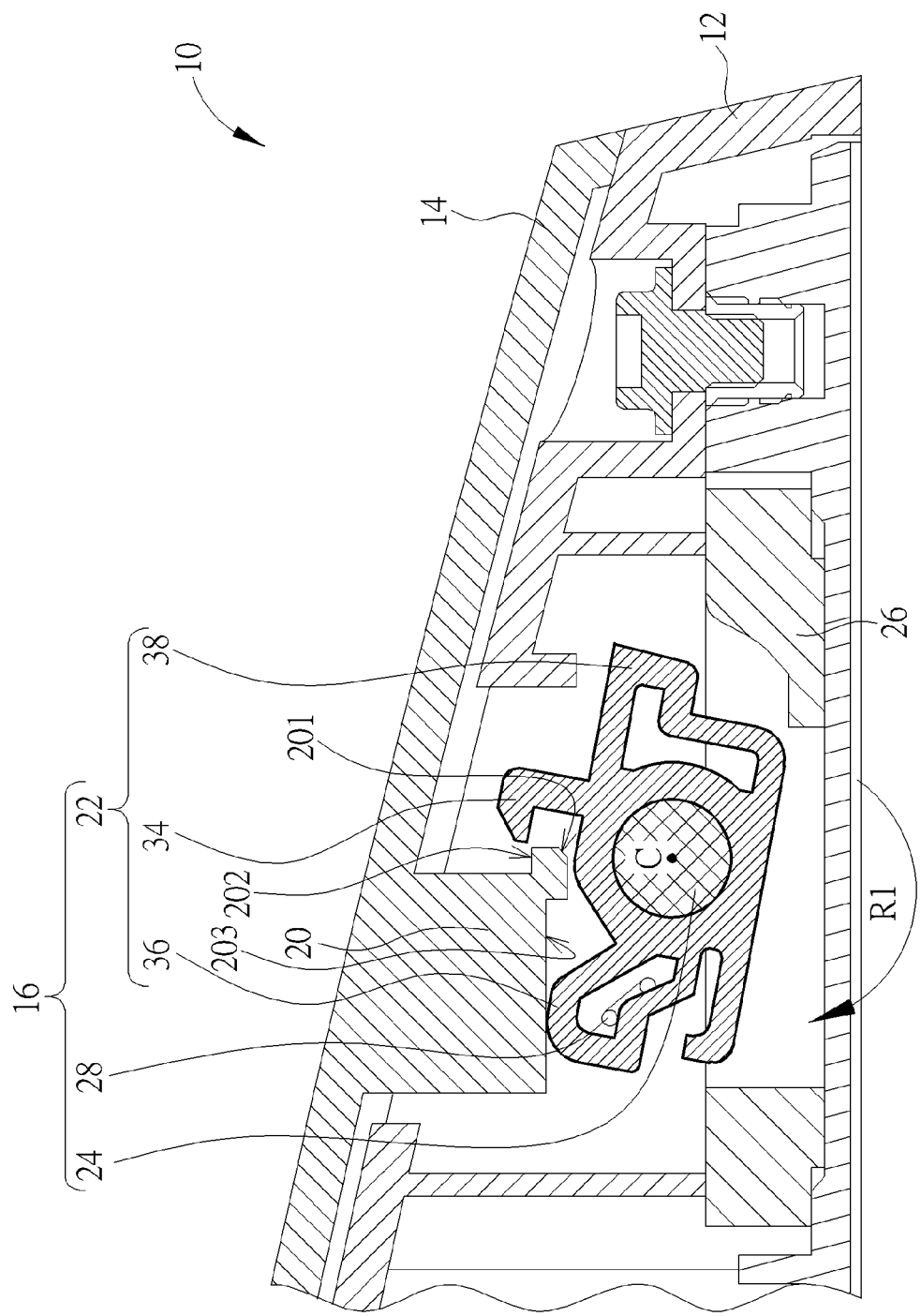
Figure 11:
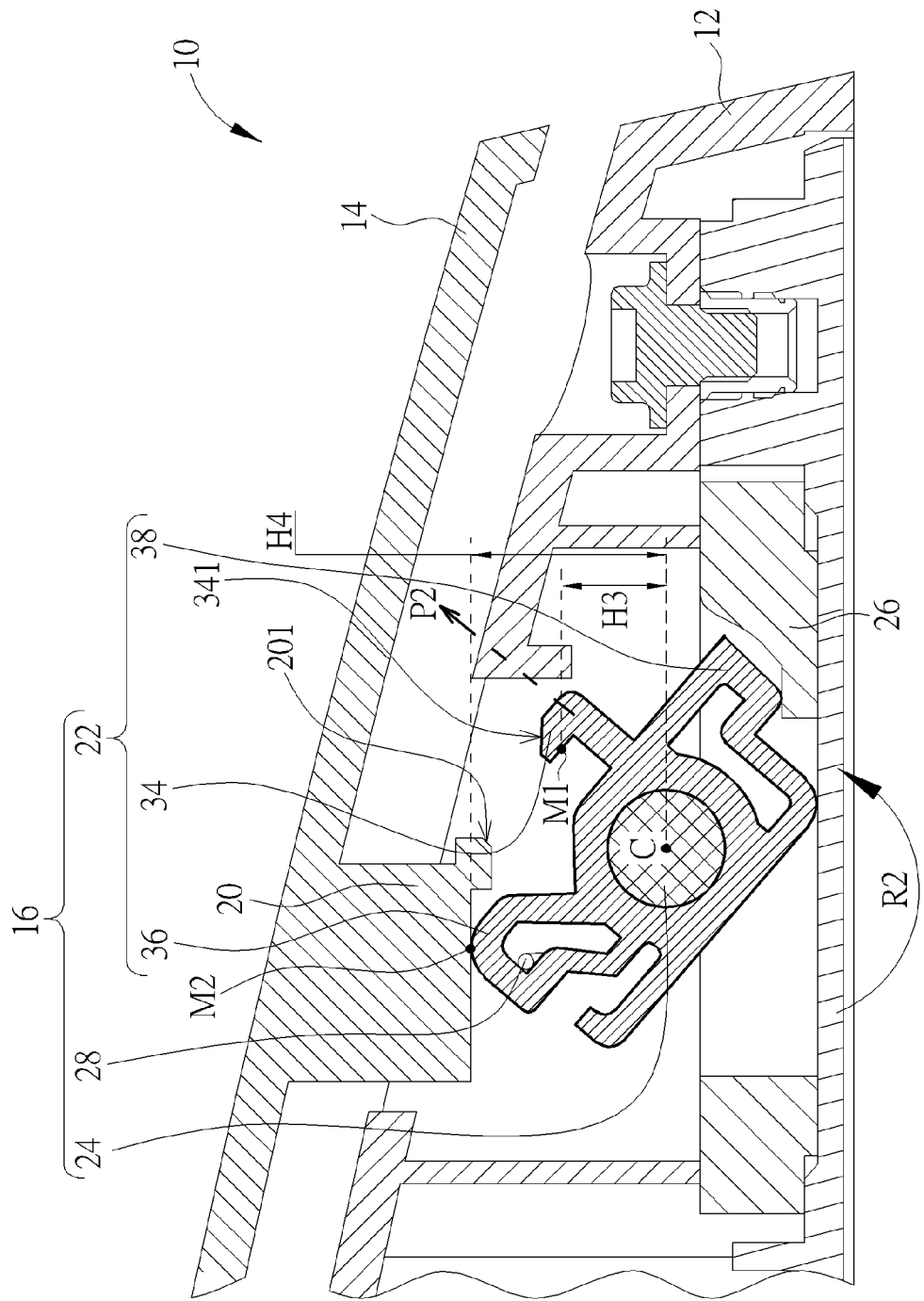

Please refer to FIG. 9 to FIG. 11. FIG. 9 to FIG. 11 respectively are diagrams of the fixing mechanism 16 in different operational process according to the embodiment of the present disclosure. The shaft body 42 of the actuating component 24 can revolve on a structural axial direction D3 (which is illustrated in FIG. 8) of the shaft body 42 to switch the buckling component 22 between a first position P1 shown in FIG. 9 and a second position P2 shown in FIG. 11. As shown in FIG. 9, the buckling component 22 is located in the first position P1, and a level height difference H1 between the hooking portion 34 and an axial center C of the hole 40 is greater than a level height difference H2 between the pushing portion 36 and the axial center C. The hooking portion 34 is engaged with a constrained surface 202 of the constraining portion 20, and the pushing portion 36 has lower position than ones of the hooking portion 34. The pushing portion 36 in this embodiment does not contact the constraining portion 20; however, the pushing portion may substantially contact the constraining portion, any design of the pushing portion that does not constrain rotation of the buckling component 22 belongs to scope of the present disclosure. As shown in FIG. 10, the actuating component 24 can be rotated at a clockwise direction R1 by the auxiliary tool, and a rotary angle of the actuating component 24 can equal ten degrees. The hooking portion 34 is separated from the constraining portion 20, and the pushing portion 36 can be gradually closed to or just contact the constraining portion 20. In the meantime, a relative movement between the base 12 and the cover 14 is not constrained by the fixing mechanism 16, and the cover 14 is still assembled with the base 12.

As shown in FIG. 11, the buckling component 22 is located in the second position P2, the hooking portion 34 is separated from the constraining portion 20, and a level height difference H3 between the hooking portion 34 and the axial center C is smaller than a level height difference H4 between the pushing portion 36 and the axial center C, so the pushing portion 36 can upwardly press a pressed surface 203 of the constraining portion 20 and the cover 14 moves outward to be disassembled from the base 12. Reference point M1 of the hooking portion 34 which corresponds to the axial center C preferably can be an outer surface of the hooking portion 34 that leans against the constrained surface 202 of the constraining portion 20, and reference point M2 of the pushing portion 36 which corresponds to the axial center C preferably can be an outer surface of the pushing portion 36 that leans against the pressed surface 203 of the constraining portion 20. Further, the fixing component 26 includes a yielded structure 264 and an abutted structure 265. The yielded structure 264 provides rotary space to the contacting portion 38 and the contacting portion 38 can contact the abutted structure 265 while the buckling component 22 is switched from the first position P1 to the second position P2. As the buckling component 22 is located in the second position P2, the contacting portion 38 leans against the fixing component 26 to constrain rotary angle of the buckling component 22, and an jacked height of the cover 14 can be controlled accordingly. Moreover, the buckling component 22 is preferably made of plastic material, and the contacting portion 38 can be a hollow resilient arm structure, which means a vacant space is formed between the contacting portion 38 and the main body 30. When the contacting portion 38 leans against the base 12, the resilient arm structure of the contacting portion 38 provides buffer function to optimize hand feeling of the fixing mechanism 16.

When the pressure generated by the auxiliary tool applied to the actuating component 24 is removed, the resilient component 28 rotates the actuating component 24 at a counterclockwise direction R2 to recover the buckling component 22 back to the first position P1. As the cover 14 is assembled with the base 12, the buckling component 22 located in the first position P1 can be directly engaged with the constraining portion 20. As the cover 14 is not assembled with the base 12, the cover 14 can be manually moved downward relative to the base 12, an inclined guiding surface 201 of the constraining portion 20 moves relative to an inclined guiding surface 341 of the hooking portion 34 to laterally push the buckling component 22, and structure interference between the buckling component 22 and the constraining portion 20 can be released accordingly. The resilient component 28 further drives the buckling component 22 back to the first position P1 since the constraining portion 20 moves across the hooking portion 34, and the buckling component 22 can be tightly engaged with the constraining portion 20 to achieve assembly of the cover 14 and the base 12.

In conclusion, the fixing mechanism of the present disclosure disposes the hooking portion and the pushing portion on the buckling component, the buckling component is rotatably assembled with the base via the actuating component and the fixing component, and the buckling component can be automatically recovered from the second position to the first position by the resilient component. The buckling component can be rotated by motion of the actuating component when the auxiliary tool is utilized to rotate the actuating component. Rotation of the buckling component not only separates the hooking portion from the constraining portion, but also drives the pushing portion to press upon the constraining portion, so that the cover can be jacked relative to the base automatically for quick-releasing function.

Comparing to the prior art, the fixing mechanism of the present disclosure has advantages of simple structure and easy operation. The fixing mechanism utilizes the actuating component to rotate the buckling component, the hooking portion and the pushing portion alternately actuates the constraining portion, and engagement stability between the buckling component and the constraining portion can be maintained without constraint deterioration by mechanical abrasion even through the cover is repeatedly assembled and disassembled, so as to obviously increase operational efficiency of assembling and disassembling the cover of the electronic device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A fixing mechanism with quick-releasing function for assembling a cover with a base, the fixing mechanism comprising:
    a buckling component, comprising:
        a main body whereon a hole is formed;
        a first wedging portion formed on an inner wall of the hole;
        a hooking portion disposed on the main body and stretching from the main body outwardly at a first direction, the hooking portion being adapted to engage with a constraining portion of the cover; and
        a pushing portion disposed on a position of the main body adjacent to the hooking portion and stretching from the main body outwardly at a second direction different from the first direction, the pushing portion being adapted to push the constraining portion; and
    an actuating component adapted to drive rotation of the buckling component, the actuating component comprising:
        a shaft body piercing through the hole and rotatably disposed on the base; and
        a second wedging portion formed on the shaft body and wedged with the first wedging portion, the shaft body being adapted to revolve on a structural axial direction of the shaft body to switch the buckling component between a first position and a second position, the hooking portion being engaged with the constraining portion to constrain a relative movement between the cover and the base while the buckling component is located in the first position, the pushing portion pushing the constraining portion to separate the cover from base while the buckling component is located in the second position.

2. The fixing mechanism of claim 1, wherein the hooking portion is engaged with a constrained surface of the constraining portion, and the pushing portion pushes a pressed surface of the constraining portion different from the constrained surface.

3. The fixing mechanism of claim 1, wherein a level height difference between the hooking portion and an axial center of the hole is greater than a level height difference between the pushing portion and the axial center while the buckling component is located in the first position, the level height difference between the hooking portion and the axial center is smaller than the level height difference between the pushing portion and the axial center while the buckling component is located in the second position.

4. The fixing mechanism of claim 1, wherein the hooking portion is engaged with the constraining portion while the buckling component is located in the first position, the hooking portion is separated from the constraining portion and the pushing portion presses the constraining portion while the buckling component is located in the second position.

5. The fixing mechanism of claim 1, further comprising:
    a fixing component disposed on the base and pressing upon the actuating component and/or the buckling component.

6. The fixing mechanism of claim 5, wherein the buckling component further comprises a contacting portion disposed on a side of the main body opposite to the pushing portion, the contacting portion leans against the fixing component to constrain rotation of the buckling component.

7. The fixing mechanism of claim 6, wherein the fixing component comprises a yielded structure and an abutted structure, the yielded structure provides rotary space to the contacting portion, and the contacting portion leans against the abutted structure.

8. The fixing mechanism of claim 6, wherein the main body comprises a first side, a second side and a third side connected with each other, the first side is connected between the second side and the third side, the hooking portion is disposed on the first side, the pushing portion and the contacting portion are respectively disposed on the second side and the third side and opposite to each other.

9. The fixing mechanism of claim 1, wherein the shaft body comprises a first section, a second section and a third section, the second section is located between the first section and the third section, the second wedging portion is disposed on the second section, the first section and the third section are rotatably disposed on the base.

10. The fixing mechanism of claim 9, wherein the shaft body further comprises at least one annular slot structure disposed on the first section and/or the third section to be rotatably engaged with the base.

11. The fixing mechanism of claim 1, further comprising:
a resilient component disposed on the shaft body, two ends of the resilient component respectively leaning against the base and the buckling component.

12. The fixing mechanism of claim 11, wherein a slide slot structure is formed on the pushing portion, an end of the resilient component is movably disposed inside the slide slot structure.

13. The fixing mechanism of claim 11, wherein the resilient component is a torsional spring.

14. An electronic device with quick-releasing function, comprising:
a base adapted to support a plurality of electronic components;
a cover assembled with the base to cover the plurality of electronic components, the cover comprising a constraining portion; and
at least one fixing mechanism disposed on the base, the fixing mechanism comprising:
a buckling component, comprising:
a main body whereon a hole is formed;
a first wedging portion formed on an inner wall of the hole;
a hooking portion disposed on the main body and stretching from the main body outwardly at a first direction, the hooking portion being adapted to engage with the constraining portion; and
a pushing portion disposed on a position of the main body adjacent to the hooking portion and stretching from the main body outwardly at a second direction different from the first direction, the pushing portion being adapted to push the constraining portion; and
an actuating component adapted to drive rotation of the buckling component, the actuating component comprising:
a shaft body piercing through the hole and rotatably disposed on the base; and
a second wedging portion formed on the shaft body and wedged with the first wedging portion, the shaft body being adapted to revolve on a structural axial direction of the shaft body to switch the buckling component between a first position and a second position, the hooking portion being engaged with the constraining portion to constrain a relative movement between the cover and the base while the buckling component is located in the first position, the pushing portion pushing the constraining portion to separate the cover from base while the buckling component is located in the second position.

15. The electronic device of claim 14, wherein the hooking portion is engaged with a constrained surface of the constraining portion, and the pushing portion pushes a pressed surface of the constraining portion different from the constrained surface.

16. The electronic device of claim 14, wherein a level height difference between the hooking portion and an axial center of the hole is greater than a level height difference between the pushing portion and the axial center while the buckling component is located in the first position, the level height difference between the hooking portion and the axial center is smaller than the level height difference between the pushing portion and the axial center while the buckling component is located in the second position.

17. The electronic device of claim 14, wherein the hooking portion is engaged with the constraining portion while the buckling component is located in the first position, the hooking portion is separated from the constraining portion and the pushing portion presses the constraining portion while the buckling component is located in the second position.

18. The electronic device of claim 14, wherein the fixing mechanism further comprises a fixing component disposed on the base and pressing upon the actuating component and/or the buckling component.

19. The electronic device of claim 18, wherein the buckling component further comprises a contacting portion disposed on a side of the main body opposite to the pushing portion, the contacting portion leans against the fixing component to constrain rotation of the buckling component.

20. The electronic device of claim 19, wherein the fixing component comprises a yielded structure and an abutted structure, the yielded structure provides rotary space to the contacting portion, and the contacting portion leans against the abutted structure.

21. The electronic device of claim 19, wherein the main body comprises a first side, a second side and a third side connected with each other, the first side is connected between the second side and the third side, the hooking portion is disposed on the first side, the pushing portion and the contacting portion are respectively disposed on the second side and the third side and opposite to each other.

22. The electronic device of claim 14, wherein the shaft body comprises a first section, a second section and a third section, the second section is located between the first section and the third section, the second wedging portion is disposed on the second section, the first section and the third section are rotatably disposed on the base.

23. The electronic device of claim 22, wherein the shaft body further comprises at least one annular slot structure disposed on the first section and/or the third section to be rotatably engaged with the base.

24. The electronic device of claim 14, wherein the fixing mechanism further comprises a resilient component disposed on the shaft body, two ends of the resilient component respectively lean against the base and the buckling component.

25. The electronic device of claim 24, wherein a slide slot structure is formed on the pushing portion, an end of the resilient component is movably disposed inside the slide slot structure.

26. The electronic device of claim 24, wherein the resilient component is a torsional spring.

* * * * *